(12) United States Patent
Yoo et al.

(10) Patent No.: US 8,581,222 B2
(45) Date of Patent: Nov. 12, 2013

(54) PHASE CHANGE MEMORY DEVICE COMPRISING BISMUTH-TELLURIUM NANOWIRES

(75) Inventors: Kyung Hwa Yoo, Seoul (KR); Nal Ae Han, Busan (KR); Sung In Kim, Seoul (KR); Jeong Do Yang, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 250 days.

(21) Appl. No.: 13/011,616

(22) Filed: Jan. 21, 2011

(65) Prior Publication Data
US 2012/0039116 A1 Feb. 16, 2012

(30) Foreign Application Priority Data
Aug. 16, 2010 (KR) ........................ 10-2010-0078800

(51) Int. Cl.
*H01L 47/00* (2006.01)

(52) U.S. Cl.
USPC ............... 257/3; 257/E21.004; 257/E45.001; 365/163; 365/148; 977/762

(58) Field of Classification Search
USPC ............... 257/3, E21.004, E45.001; 365/163, 365/148; 977/762
See application file for complete search history.

(56) References Cited

U.S. PATENT DOCUMENTS

| | | | |
|---|---|---|---|
| 7,098,393 B2 * | 8/2006 | Fleurial et al. ................. | 136/240 |
| 2007/0221906 A1 * | 9/2007 | Hideki et al. ..................... | 257/2 |

* cited by examiner

*Primary Examiner* — Long Pham
(74) *Attorney, Agent, or Firm* — McKenna Long & Aldridge, LLP

(57) ABSTRACT

The present invention relates to a phase change memory device comprising bismuth-tellurium nanowires. More specifically, the bismuth-tellurium nanowires having PRAM characteristics may be prepared by using a porous nano template without any high temperature process and said nanowires may be used in the phase change memory device by using their phase change characteristics to identify memory characteristics.

18 Claims, 13 Drawing Sheets

PHASE CHANGE MEMORY DEVICE COMPRISING BISMUTH-TELLURIUM NANOWIRES

This application claims the benefit of Korean Patent Application No. 10-2010-0078800, filed on Aug. 16, 2010, which is hereby incorporated by reference for all purposes as if fully set forth herein.

FIELD OF THE INVENTION

The present invention relates to a phase change memory device comprising bismuth-tellurium nanowires, and more specifically, a phase change memory device comprising bismuth-tellurium nanowires which may be used in the phase change memory device by preparing bismuth-tellurium nanowires having a PRAM (Phase Change Random Access Memory) characteristic using a porous nano template without any high temperature process, and indentifying memory switching by means of the phase change characteristic of said nanowires.

BACKGROUND OF THE INVENTION

Binary information is recorded, deleted and deciphered in memories using change of physical properties in electrical, magnetic, optical characteristics, and the like, of materials. Among such memories, a PRAM (Phase change Random Access Memory) to be in the limelight as the upcoming nonvolatile memory is a memory that information is recorded, deleted and deciphered using change in optical and electrical characteristics of materials according to the phase change. An optical memory utilizes reflectance to be different on changing a material state with a laser, while a phase change memory utilizes change of electrical conductance (specific resistance) on changing it with electrical signals. That is, when a material is in an amorphous phase, it has very high specific resistance. When it is in a crystalline phase that atoms are regularly arranged, it has low specific resistance. Then, binary information may be stored, deleted and deciphered using a different electrical conductance according to such a state.

When upper and bottom metal electrodes are linked to a power circuit, following applying voltage, current is carried through a part that a phase change material is in contact with the electrodes, wherein Joule's heat is generated at the contact areas according to Joule's law. As the electrical conductance (specific resistance) is changed on changing the material state by Joule's heat, a crystalline phase material and an amorphous material may be switched into an amorphous phase material and a crystalline phase material, respectively, using electrical signals. Since the resulting two phases are very stable, they are not erased even though power of the device is off, so that they may be used as nonvolatile memories.

In other words, recording of information (SET) refers to changing the material state from an amorphous phase (off state) to a crystalline phase (on state), for which long low current pulses are provided for an amorphous phase material (FIG. 1a). On the contrary, if short high current pulses are provided for a crystalline material being in on state to delete information (RESET), the crystalline phase is changed into the amorphous phase to be in off state (FIG. 1b).

Such a phase change memory has a simple structure compared with other nonvolatile memories and a benefit that an input-output speed is fast. It has been developed as a device having a thin film form based on GST (Ge, Sb, Te) being chalcogenides so far, and also researched for materials by means of doping elements such as Se and Bi. Recently, a variety of trials are carried out by realizing a PRAM or forming a thin film with nanowires prepared by high temperature processes such as CVD. However, in such processes, there are disadvantages that composition ratios in said elements are not easily controlled and they have complicated preparation processes and high production costs per unit.

BRIEF SUMMARY OF THE INVENTION

The present invention is devised to improve the prior art problems and intended to provide a phase change memory device prepared by electrolytically depositing bismuth-tellurium nanowires having a phase change characteristic in a porous nano template without any high temperature process, and a method of preparing the same.

To achieve said object, the present invention provides a phase change memory device comprising a substrate; and at least one $Bi_xTe_y$ (x/y<1) nanowire formed on said substrate.

The present invention also provides a method of preparing the present phase change memory device comprising steps of
immersing a template formed on a substrate and having at least one pore in an electrolyte containing a bismuth precursor and a tellurium precursor; and
electrolytically depositing $Bi_xTe_y$ (x/y<1) nanowires in the pores of said template by applied voltage.

The present invention also provides a method of deleting information in the present phase change memory device comprising a step of applying voltage pulses of 7 to 8 V and 30 to 50 ns to at least one $Bi_xTe_y$ (x/y<1) nanowire formed on a substrate.

The present invention also provides a method of recording information in the present phase change memory device comprising a step of applying voltage pulses of 1 to 2 V and 90 to 110 ns to at least one $Bi_xTe_y$ (x/y<1) nanowire formed on a substrate.

The present invention also provides an electronic device comprising a phase change memory device according to the present invention.

In addition to benefits that bismuth-tellurium is electrolytically deposited in a porous template to prepare nanowires having a PRAM characteristic without any high temperature process, easy and prompt production may be possible due to no high temperature process and the unit cost of production may decrease, the present invention has advantages that low programming current may be expected, since nanowires have low cell volume for the melting point to be reduced and a thermal interference which can be generated on being scaled down, may be inhibited.

DETAILED DESCRIPTION OF THE INVENTION

Figure 1:
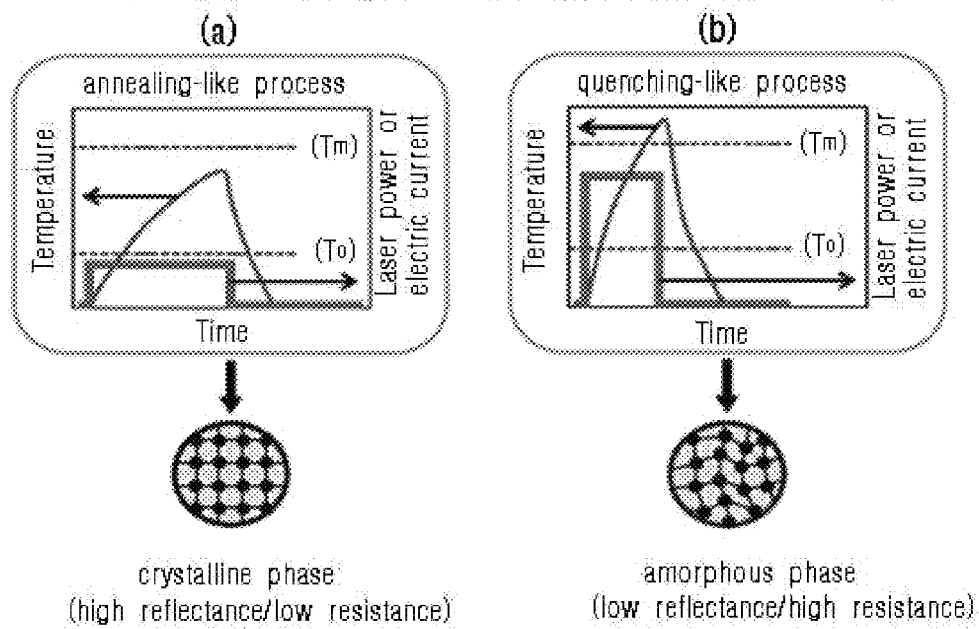
FIG. 1 represents characteristics of pulses applied for forming a crystalline condition and an amorphous condition in a phase change memory.

The constitution of the present invention is specifically explained below.

The present invention relates to a phase change memory device comprising a substrate; and at least one $Bi_xTe_y$ (x/y<1) nanowire formed on said substrate.

The present phase change memory device may comprise one pair of electrodes to which voltage is applied. Preferably, said electrode may be a metal electrode.

In addition, said nanowire may be formed in pores of a template positioned on a substrate.

Said template may have at least one pore. Preferably, it may be anodic aluminum oxide (AAO).

Said $Bi_xTe_y$ (x/y<1) nanowire, wherein x is 2 and y is 3, is preferred.

Said nanowire is in an amorphous phaseon applying voltage pulses (AP) of 7 to 8 V and 30 to 50 ns and changed to a crystalline phaseon applying voltage pulses (CP) of 1 to 2 V and 90 to 110 ns, so that it is characterized by having a PRAM (phase change random access memory) characteristic which represents phase change depending on the applied voltage pulse amplitude and time.

According to one embodiment of the present invention, said nanowire shows a tendency that its resistance value is slightly reduced, on increasing temperature, because the nanowire is in a crystalline phase. The resistance value rapidly increases at about 231° C., but it remains in high resistance condition, even if the temperature again decreases. Here, since the resistance increases at the same time as the phase change occurs from the crystalline phase to the amorphous phase, it can be noted that such resistance increase results from the phase change of the nanowire.

According to other embodiment of the present invention, the phase change memory controls the electrical conductance (specific resistance) by applying electric pulses and generating Joule's heat at the contact area to change the material phase. If voltage pulses (AP) of 7.5 V and 40 ns are applied to said nanowire being the initial crystalline phase, the nanowire is changed to the amorphous phase having high resistance. If voltage pulses (CP) of 1.5 V and 100 ns are applied thereto, it is changed to the crystalline phase having low resistance. This change is reproducible. It is proved from such PRAM characteristics of the nanowire that said nanowire may be applied to a phase change memory device.

Said nanowire, a diameter of which is 10 nm to 200 nm, may be used.

In addition, said substrate may include silicon, a flexible polyimide film, or a polyester film, and the like, which is not particularly limited thereto.

The present invention also relates to a method of preparing a phase change memory device according to the present invention comprising steps of immersing a template formed on a substrate and having at least one pore in an electrolyte containing a bismuth precursor and a tellurium precursor; and electrolytically depositing $Bi_xTe_y$ (x/y<1) nanowires in the pores of said template by applied voltage.

The method of preparing a phase change memory device of the present invention is characterized in that the nanowire having a PRAM characteristic is prepared without any high temperature process by electrodepositing bismuth-tellurium in pores of the porous nano template. There are advantages that easy and prompt production may be possible due to no high temperature process and the unit cost of production may be lowered. In addition, there are advantages that low programming current may be expected, since nanowires have low cell volume for the melting point to be reduced and a thermal interference which can be generated on being scaled down, may be inhibited.

Figure 2:
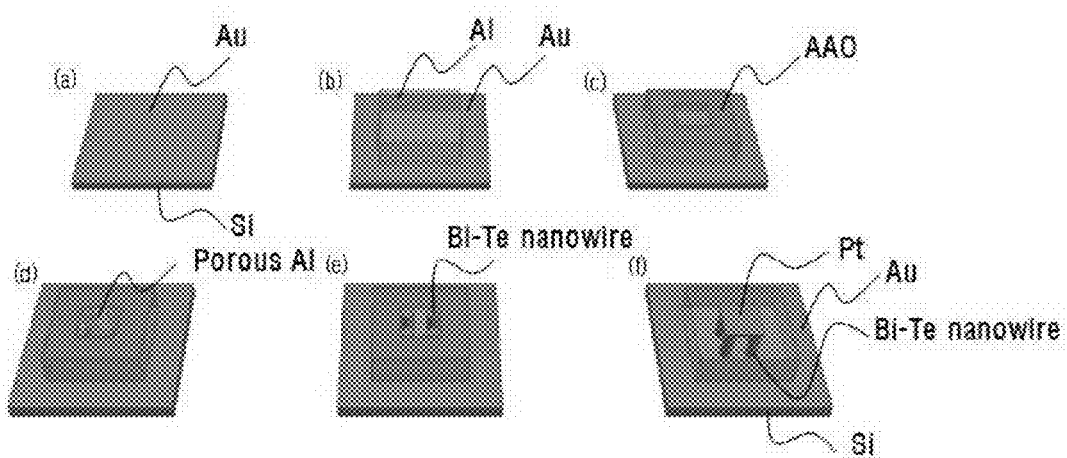
FIG. 2 depicts a schematic view of procedures for preparing a phase change memory device according to the present invention.

With reference to FIG. 2, the method of preparing a phase change memory device of the present invention is particularly explained step by step below.

The first step is a step of preparing a porous template on s substrate and immersing said template in an electrolyte containing a bismuth precursor and a tellurium precursor (FIG. 2a-d).

Said porous template may be one having at least one pore. More preferably, it may be anodic aluminum oxide (AAO).

When anodic aluminum oxide (AAO) is used as said porous template, general technology may be used as procedures for forming said template on a substrate, without being particularly limited. According to one embodiment, it may comprise the following steps:

a first step of depositing on a substrate a metal electrode, such Au and Pt, to be used as a bottom electrode (FIG. 2a);

a second step of patterning Al on the electrode by means of a lithography method and a lift-off method, followed by deposition (FIG. 2b); and a third step of passivating the other part with a resist, such that only a part to form AAO can be exposed to an electrolyte solution, followed by anodization (FIGS. 2c and d).

Figure 3:
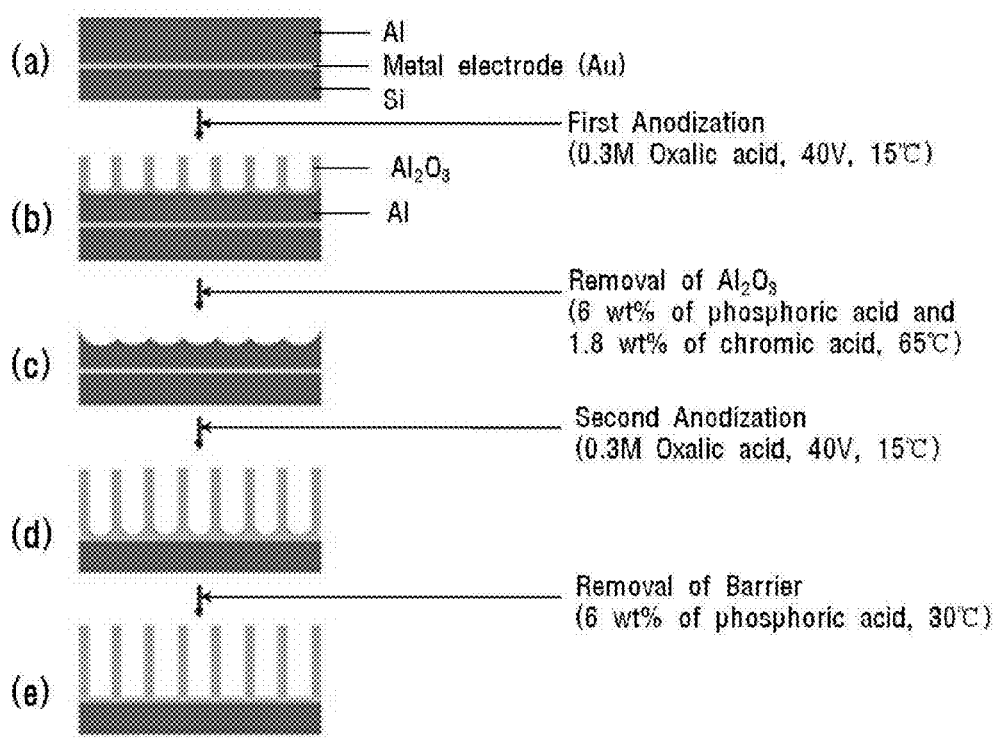
FIG. 3 depicts a schematic view of procedures for an anodization experiment.

With reference to FIG. 3, said anodization method of Al is explained below (FIG. 2c, d).

Al is anodized by using an acid solution as an electrolyte for anodization and applying voltage (FIG. 3a, b).

When the AAO layer formed after carrying out the first anodization is melted in an acid solution such as a mixed solution of chromic acid ($H_2CrO_4$) and phosphoric acid ($H_3PO_4$), all the formed AAO layer is removed to form a porous structure (pore) on the remaining Al layer (FIG. 3c).

The second anodization is carried out using said porous structure as a guide, until current between the Al electrode and the carbon electrode is to 0 (FIG. 3d).

After anodization, an alumina (AAO) barrier is formed at the end of AAO and subsequently, removed by means of a method of immersing an AAO template prepared at room temperature in an acid solution for 30 to 40 minutes (FIG. 3e).

The anodic aluminum oxide template prepared through the above steps may have a pore size of 50 to 200 nm and a thickness of 50 to 800 nm.

One or two or more of $Bi(NO_3)_3 5H_2O$, $BiNBO_4$, $Bi_2VO_5$, or $BiMe_2(Me_2NCH_2Ph)$, and the like, may be used as said bismuth precursor.

One or two or more of $TeO_2$, CdTe, CdZnTe, or HgCdTe, and the like, may be used as said tellurium precursor.

Preferably, said bismuth precursor and tellurium precursor are mixed such that a composition ratio ($Bi_xTe_y$) of bismuth and tellurium is x/y<1 and more specifically, 2:3, but on departing from the above range, the nanowire shows no characteristic of phase change memory.

In the method of preparing a phase change memory device of the present invention, the second step is a step of applying voltage to a mixed solution of the template and the electrolytes to electrolytically deposit the bismuth-tellurium nanowire in a pore of the template (FIG. 2e).

Said voltage is −0.5 to 1 V such that electrolytic deposition of the nanowire is homogeneously carried out. More specifically, the voltage is preferably −0.1 to 0 V, wherein about −0.01 V may be used.

Triode electrochemical deposition may be used as said electrolytic deposition, without being particularly limited thereto.

The bismuth-tellurium nanowire prepared through the above steps may be a $Bi_xTe_y$ (x/y<1) nanowire. More specifically, it may be $Bi_2Te_3$.

In the method of preparing a phase change memory device of the present invention, the third step is a step of preparing a metal electrode, for example, Pt having a nano size, for example, 30 to 60 nm to be used as a top electrode by a DC sputter (FIG. 2f).

In addition, the method of preparing a phase change memory device of the present invention may further comprise a step of immersing the template electrolytically deposited with a bismuth-tellurium nanowire in a basic solution and dissolving said template.

Said basic solution may be NaOH or KOH, without being particularly limited thereto.

The step to dissolve said template may be carried out by repeating several times a process of immersing a porous template deposited with nanowires in a basic solution, centrifuging and washing a pellet with distilled water, without being particularly limited thereto.

The present invention also relates to a method of deleting information in a phase change memory device of the present invention comprising a step of applying voltage pulses of 7 to 8 V and 30 to 50 ns to at least one $Bi_xTe_y$ (x/y<1) nanowire formed on a substrate.

When voltage pulses of 7 to 8 V and 30 to 50 ns are applied to the present bismuth-tellurium nanowires in a phase change memory device of the present invention, information in the phase change memory device may be deleted by changing the memory to an amorphous phase having high resistance.

The present invention also relates to a method of recording information in a phase change memory device of the present invention comprising a step of applying voltage pulses of 1 to 2 V and 90 to 110 ns to at least one $Bi_xTe_y$ (x/y<1) nanowire formed on a substrate.

When voltage pulses of 1 to 2 V and 90 to 110 ns are applied to the present bismuth-tellurium nanowires in a phase change memory device of the present invention, information in the phase change memory device may be recorded by changing the memory to a crystalline phase having low resistance.

The present invention also relates to an electronic apparatus comprising a phase change memory device according to the present invention.

In addition to benefits that bismuth-tellurium is electrolytically deposited in a porous template to prepare nanowires having a PRAM characteristic without any high temperature process, easy and prompt production may be possible due to no high temperature process and the unit cost of production may decrease, the present invention has advantages that low programming current may be expected, since nanowires have low cell volume for the melting point to be reduced and a thermal interference which can be generated on being scaled down, may be inhibited, so that it may be applied to electronic apparatuses, such as computers; potable personal terminals such as PMP (Portable Multimedia Player), UMPC (Ultra-mobile PC), smart-phone and mini-notebook; and optical storage information apparatuses such as CD-RW (Compact Disc-Rewritable) and DVD (Digital Video Disc).

Hereinafter, the present invention is explained in more detail via examples according to the present invention, but the scope of the present invention is not restricted to the following examples.

EXAMPLES

Example 1

Preparation of Phase Change Memory Device

With reference to a schematic view of FIG. 2, a process of preparing a phase change memory device is explained below.

First, a metal electrode to be used as a bottom electrode, such as Au and Pt, was deposited on a silicon substrate (FIG. 2a).

On the electrode, Al with a thickness of about 1 μm was patterned by means of a lithography method and a lift-off method, and then deposited (FIG. 2b).

Then, the other part was passivated with a resist, such that only a part to form AAO can be exposed to an electrolyte solution, followed by anodization (FIG. 2c, d).

With reference to FIG. 3, the method of anodizing Al is amplified below (FIG. 2c, d).

Oxalic acid ($C_2H_2O_4$, 0.3 M) was used as an electrolyte for anodization, wherein the temperature was maintained at 15° C. and a voltage of 40 V was applied.

First, when the AAO layer formed after carrying out the first anodization for about 2 minutes was dissolved in a mixed solution of 1.8% by weight of chromic acid ($H_2CrO_4$) and 6% by weight of phosphoric acid ($H_3PO_4$) at 60° C. for about 10 minutes, all the formed AAO layer was removed to form a porous structure (pore) on the remaining Al layer.

The second anodization was carried out using such porous structure as a guide, until current between the Al electrode and the carbon electrode was to 0.

After anodization, an alumina (AAO) barrier was formed at the end of AAO and subsequently, removed by means of a method of immersing an AAO template prepared at room temperature in 6% by weight of phosphoric acid solution at 30° C. for 30 minutes (FIG. 3e).

Figure 4:
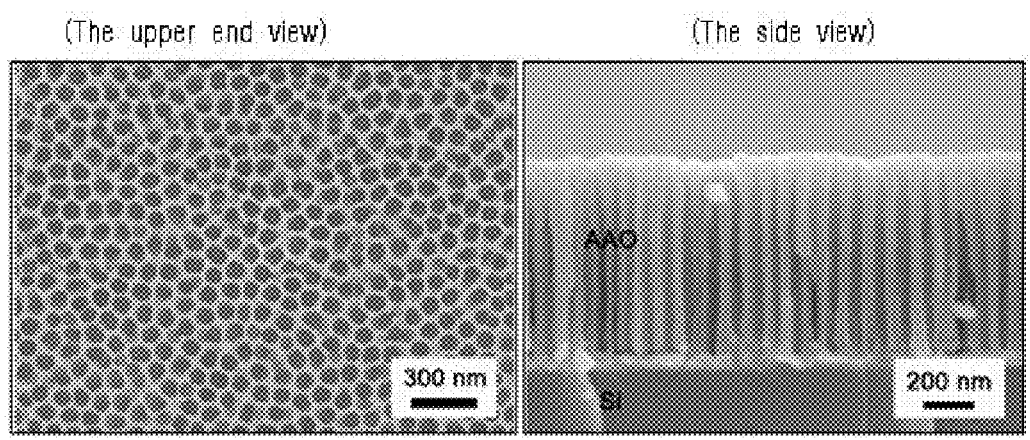
FIG. 4 is top and side electron micrographs of an anodic aluminum oxide (AAO) template in a phase change memory device according to the present invention.

FIG. 4 is electron micrographs showing top and side appearance of the AAO template prepared via the above method.

Figure 6:
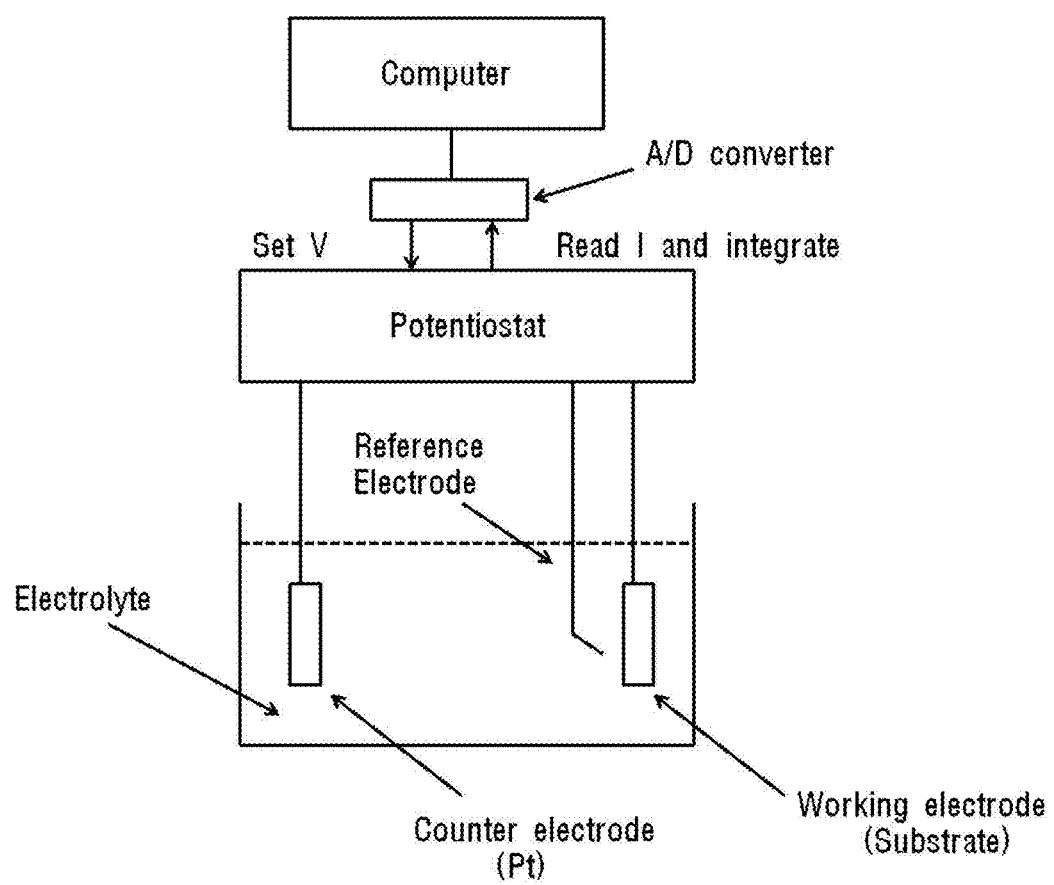
FIG. 6 depicts a schematic view of an electrolytic polishing experimental apparatus for triode electrochemical deposition according to one aspect of the present invention.

Then, to electrolytically deposit the $Bi_2Te_3$ nanowire, AAO was immersed in an electrolyte that 0.01M $Bi(NO_3)_3 5H_2O$ and 0.01M $TeO_2$ were dissolved in 1M $HNO_3$ and a voltage of −0.01 V was applied thereto (FIG. 2e). In this experiment, a triode electrochemical deposition method was used (FIG. 6).

Next, Pt to be used as a top electrode was prepared as an electrode having about 50 nm by a DC sputter (FIG. 2f).

Here, to remove the AAO template deposited with the $Bi_2Te_3$ nanowires in pores, the NaOH solution including the AAO template deposited with the nanowires was centrifuged at a speed of 4900 rpm for 15 minutes. The supernatant fluid was removed from the centrifuged solution, followed by filling the remaining part with distilled water, and the resulting solution was again centrifuged at a speed of 4900 rpm for 15 minutes, followed by removing the supernatant fluid and filling with distilled water. Such procedures were carried out two or more times. Finally, after carrying out two or more times, the supernatant fluid was removed and filled with 99.95% ethanol.

Figure 5:
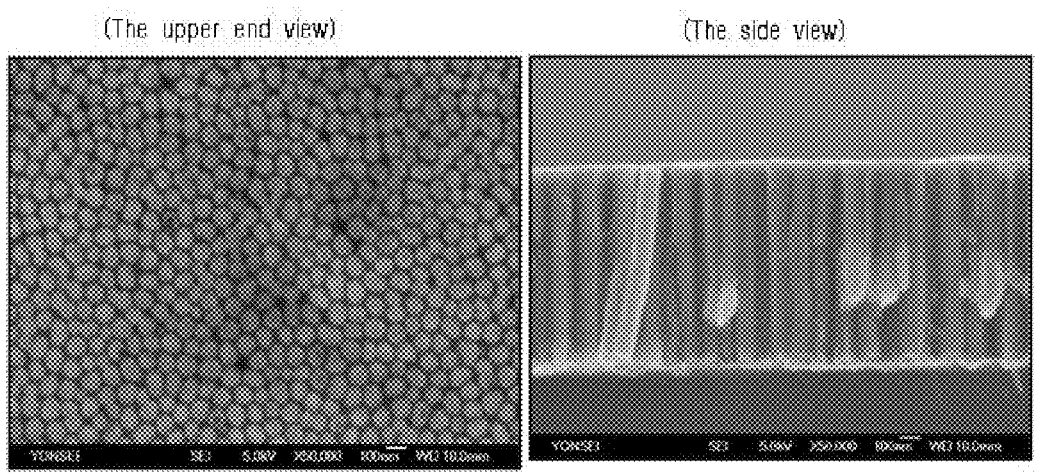
FIG. 5 is top and side electron micrographs of a $Bi_2Te_3$ nanowire array according to the present invention.

FIG. 5 is electron micrographs showing that the nanowires are electrolytically deposited in top and side surfaces of the AAO template prepared via the above method.

Experimental Example 1

Investigation of $Bi_2Te_3$ Characteristics

Figure 7:
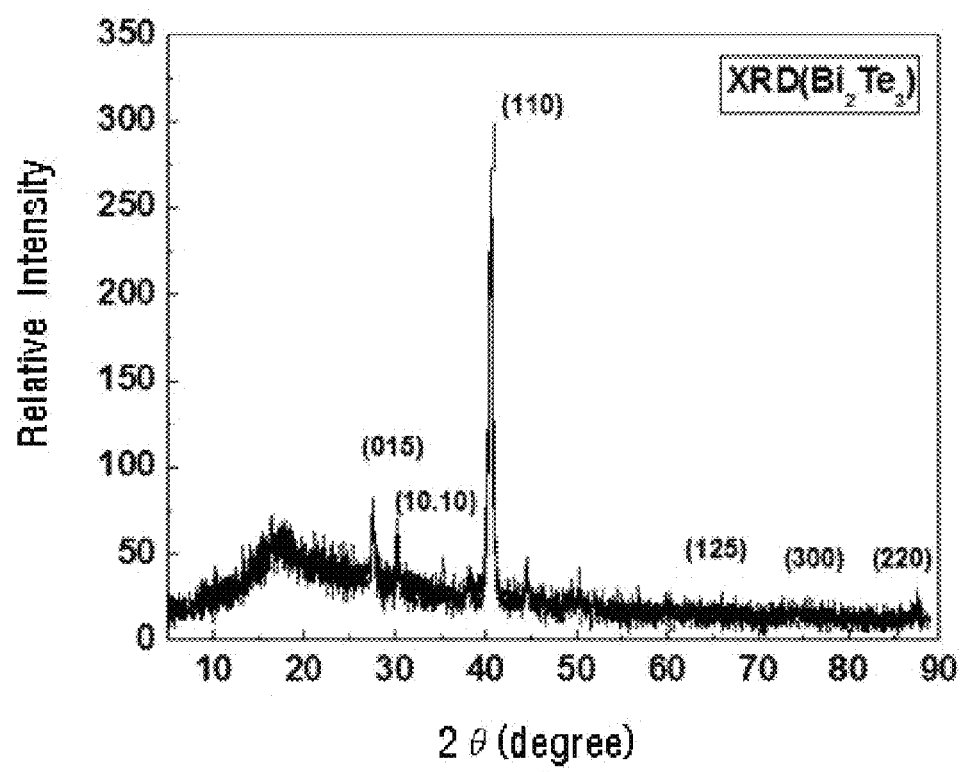
FIG. 7 represents an X-ray diffraction pattern of the $Bi_2Te_3$ nanowire according to the present invention.

FIG. 7 being a result of measuring X-ray diffraction of $Bi_2Te_3$ prepared in the above example 1 represented a polycrystalline structure, wherein a main peak in a direction (110) and peaks in other directions are present.

Figure 8:
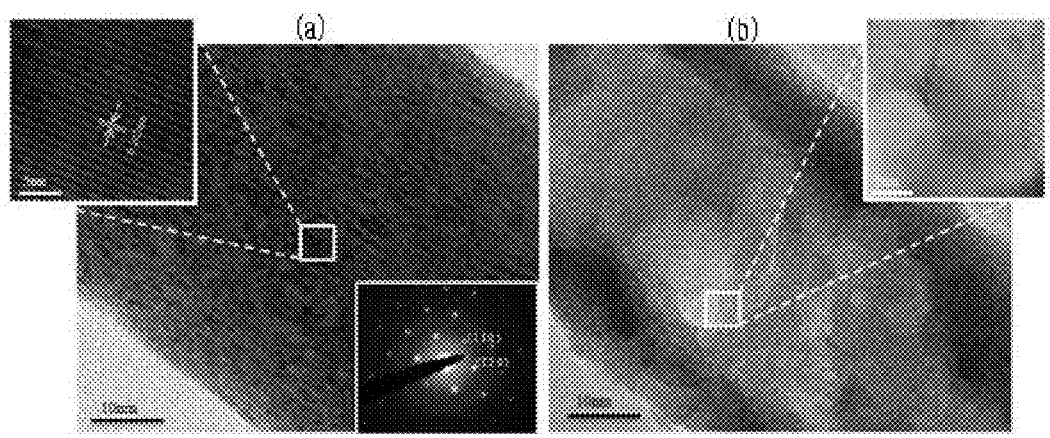
FIG. 8 is transmission electron micrographs of the $Bi_2Te_3$ nanowires fully separated from the AAO template according to the present invention, wherein (a) represents check and diffraction patterns of the $Bi_2Te_3$ nanowires in a crystalline phase and (b) represents the amorphous phase boundary of the $Bi_2Te_3$ nanowires by phase change.

In addition, as a result of observation for microstructures using a transmission electron microscope, the diffraction patterns (inside of FIG. 8(a)) were identical to the results of measuring X-ray diffraction as well as the crystalline structure was observed as shown in FIG. 8(a).

The phase of $Bi_2Te_3$ nanowires was changed depending on temperature, and thus, for identifying change of resistance value, temperature dependency of resistance was measured.

Figure 9:
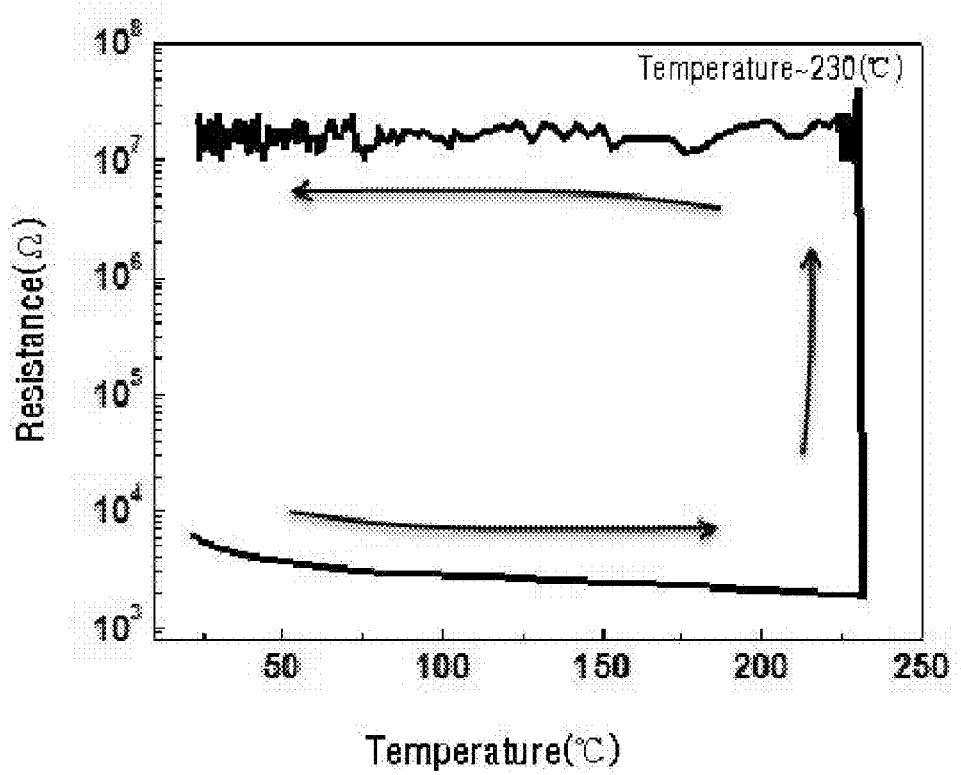
FIG. 9 represents resistance change characteristics of the $Bi_2Te_3$ nanowire device of the present invention depending on temperature, wherein direction of the arrows represents that of resistance change depending on temperature change.

As shown in FIG. 9, as temperature increased, the resistance value was slightly reduced, because the initial phase nanowires were a crystalline phase. However, the resistance value rapidly increased at about 231° C., and the condition of high resistance was maintained, even though the temperature was again reduced.

FIG. 8(b) is a TEM image measured after the temperature dependency of resistance was measured.

The change of phase from a crystalline phase to an amorphous phase occurred, and thus, it could be seen that the increase of resistance results from the phase change of the $Bi_2Te_3$ nanowires.

Figure 10:
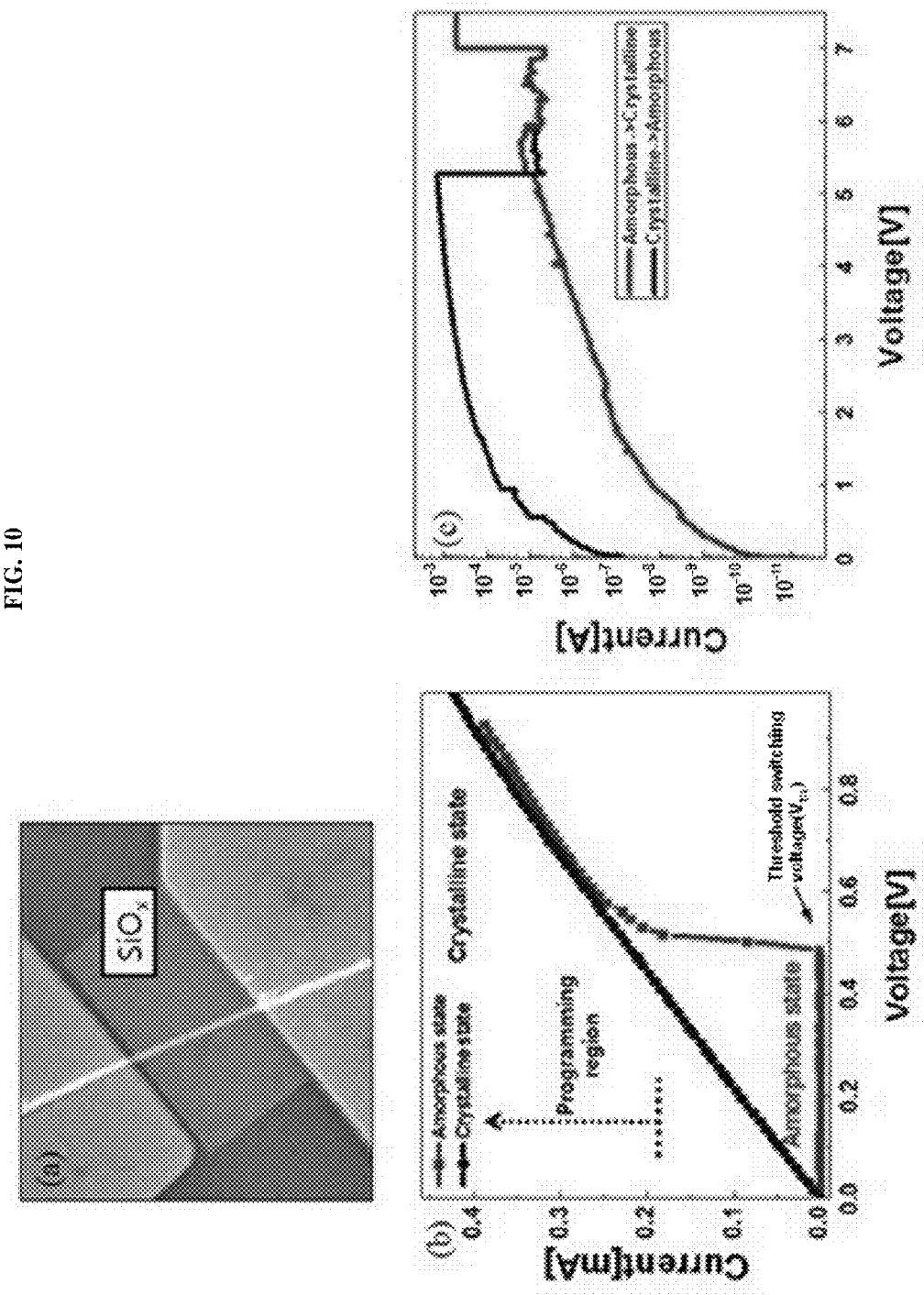
FIG. 10 represents resistance change characteristics of the $Bi_2Te_3$ nanowire device of the present invention, wherein (a) is FESEM images of individual nanowire devices, (b) represents resistance change characteristics of the nanowire in the initial amorphous phase depending on the applied voltage, and (c)) represents resistance change characteristics of the $Bi_2Te_3$ nanowire device in a condition phase-changed by applying voltage thereto.

FIG. 10(a) is a FESEM image of individual nanowire device. The electrode was prepared with platinum, and for inhibiting oxidation, a protective film was prepared on the nanowires with silicon oxide.

In FIG. 10(b), when the nanowires were in a high resistance condition, their resistance was reduced, with changing from the amorphous phase to the crystalline phase at about 0.5 V. Such a phase change was reproducible as shown in FIG. 10(c).

The phase change memory controls the electrical conductance (specific resistance) by applying electric pulses and generating Joule's heat at the contact area to change the material phase.

Figure 11:
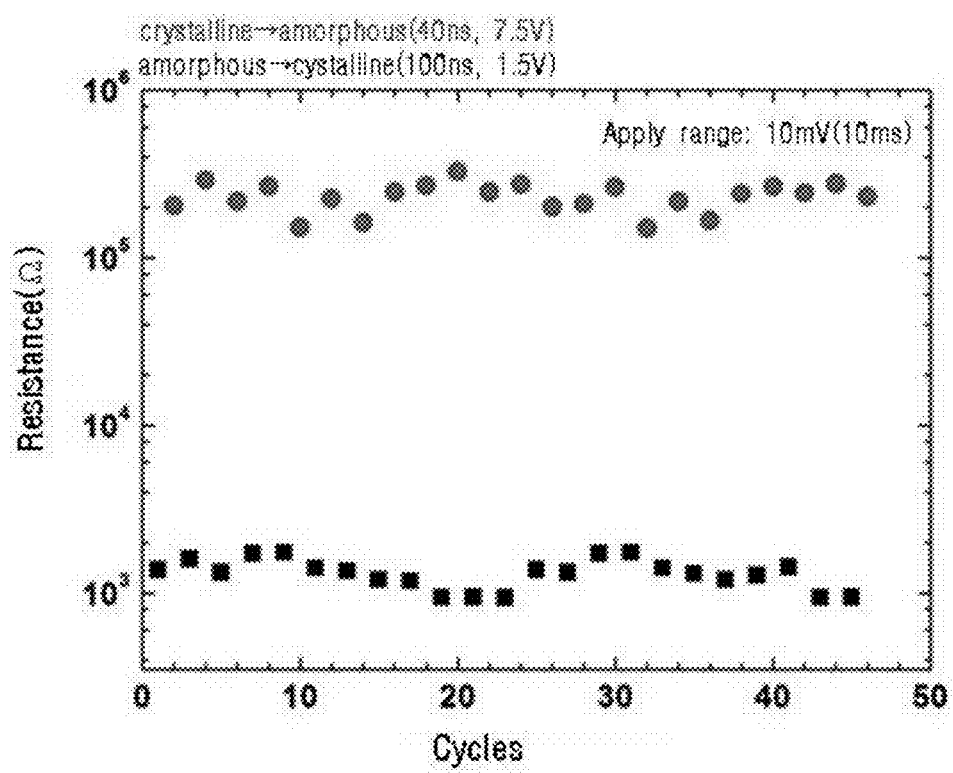
FIG. 11 represents resistance change characteristics of the $Bi_2Te_3$ nanowire array device of the present invention depending on the repeated electric pulses.

FIG. 11 is a characteristic of the memory measured by repeatedly applying voltage pulses (AP) of 7.5 V and 40 ns and voltage pulses (CP) of 1.5 V and 100 ns to a material having the initial crystalline phase. If the AP was applied thereto, the material was changed to an amorphous phase having high resistance. If the CP was applied thereto, it was changed to a crystalline phase having low resistance. This result showed that the $Bi_2Te_3$ nanowires can be applied as a phase change memory device.

Figure 12:
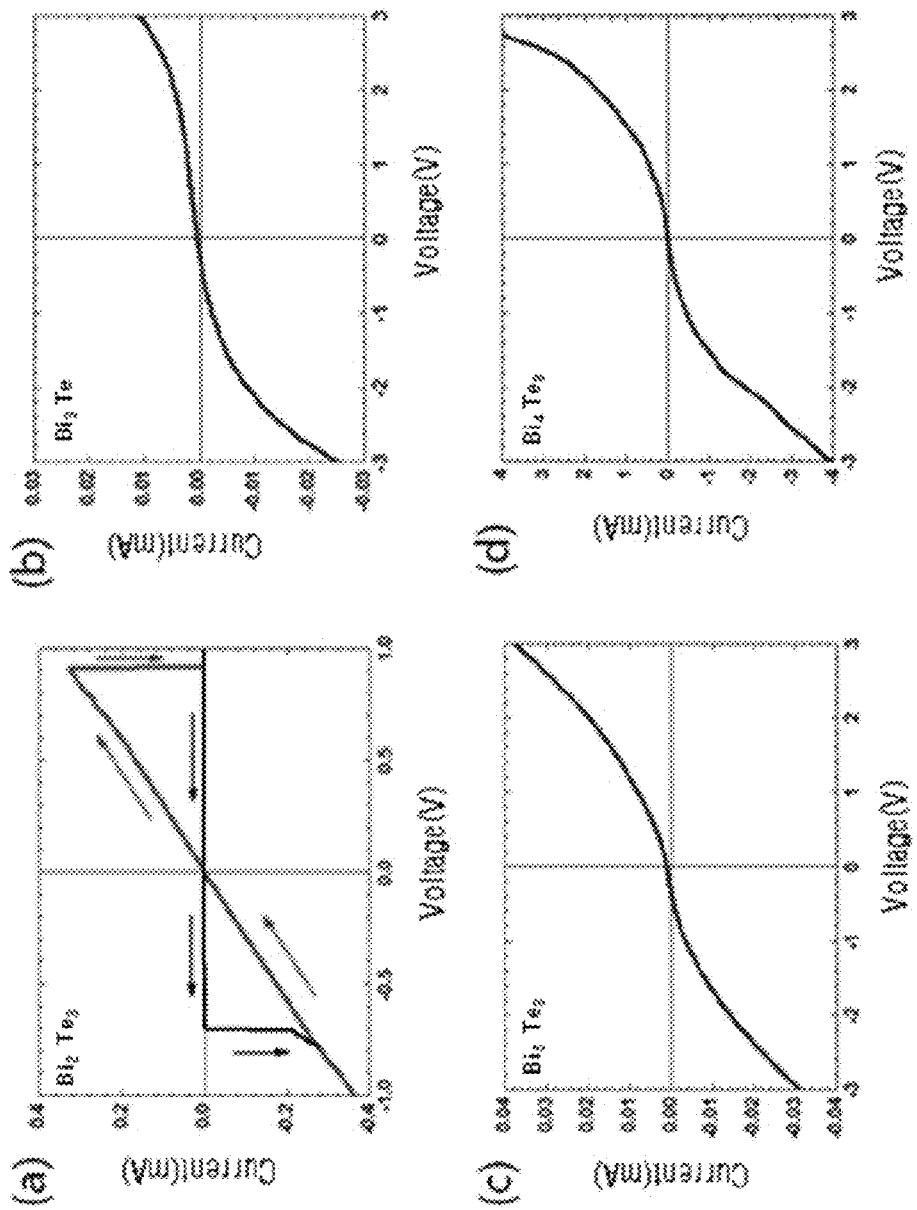
FIG. 12 represents phase change characteristics of the $Bi_2Te_3$ nanowires of the present invention depending a composition ratio.
Figure 13:
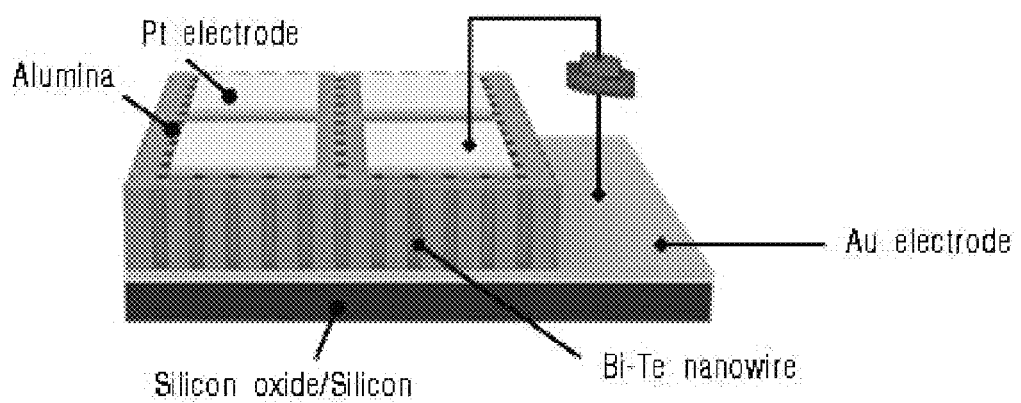
FIG. 13 depicts a schematic view of a phase change memory device deposited with the bismuth-tellurium nanowires of the present invention.

In addition, FIG. 12 is a result of examining phase change characteristics of the present nanowires by varying its composition, wherein $Bi(NO_3)_3 5H_2O$ and $TeO_2$ are mixed in a ratio of a) 0.01M:0.01M ($Bi_2Te_3$), b) 0.01M:0.02M($Bi_3Te$), c) 0.02M:0.01M ($Bi_5Te_3$), and d) 0.01M:0.005M ($Bi_4Te_3$).

As shown in FIG. 12, a phase change characteristic, the composition of which bismuth and tellurium is 2:3, was represented (FIG. 12a).

The bismuth-tellurium nanowires of the present invention have a PRAM characteristic, so that it may be used for a phase change memory device.

The invention claimed is:

1. A phase change memory device comprising a substrate; and at least one $Bi_2Te_3$ nanowire formed on said substrate, wherein the nanowire has a PRAM (Phase change Random Access Memory) characteristic representing an amorphous phase (AP) on applying voltage pulses of 7 to 8 V and 30 to 50 ns and a crystalline phase (CP) on applying voltage pulses of 1 to 2 V and 90 to 110 ns.

2. The phase change memory device according to claim 1, wherein it comprises one pair of electrodes applying voltage to said nanowires.

3. The phase change memory device according to claim 2, wherein said electrode is a metal electrode.

4. The phase change memory device according to claim 1, wherein said nanowire is formed in a pore of a template positioned on a substrate.

5. The phase change memory device according to claim 4, wherein said template is anodic aluminum oxide (AAO).

6. The phase change memory device according to claim 1, wherein the nanowire has a diameter of 10 to 200 nm.

7. The phase change memory device according to claim 1, wherein the substrate is silicon, a flexible polyimide film or a polyester film.

8. A method of preparing a phase change memory device of claim 1 comprising steps of
immersing a template formed on a substrate and having at least one pore in an electrolyte containing a bismuth precursor and a tellurium precursor; and
electrolytically depositing $Bi_xTe_y$, (x/y<1) nanowires in the pores of said template by applied voltage.

9. The method of preparing a phase change memory device according to claim 8, wherein the template is anodic aluminum oxide (AAO).

10. The method of preparing a phase change memory device according to claim 9, wherein the anodic aluminum oxide template has a pore size of 10 to 200 nm and a thickness of 50 nm to 800 nm.

11. The method of preparing a phase change memory device according to claim 8, wherein the bismuth precursor is one or more selected from the group consisting of $Bi(NO_3)_3 5H_2O$, $BiNBO_4$, $Bi_2VO_5$ and $BiMe_2(Me_2NCH_2Ph)$.

12. The method of preparing a phase change memory device according to claim 8, wherein the tellurium precursor is one or more selected from the group consisting of $TeO_2$, CdTe, CdZnTe and HgCdTe.

13. The method of preparing a phase change memory device according to claim 8, wherein the voltage applied in the step of electrolytically depositing is a size of −0.5 to 1 V.

14. The method of preparing a phase change memory device according to claim 8, further comprising a step of immersing a template electrolytically deposited with nanowires in a basic solution to dissolve said template.

15. The method of preparing a phase change memory device according to claim 14, wherein the basic solution is NaOH or KOH.

16. A method of deleting information in a phase change memory device of claim 1 comprising a step of applying voltage pulses of 7 to 8 V and 30 to 50 ns to at least one $Bi_xTe_y$ (x/y<1) nanowire formed on a substrate.

17. A method of recording information in a phase change memory device of claim 1 comprising a step of applying voltage pulses of 1 to 2 V and 90 to 110 ns to at least one $Bi_xTe_y$ (x/y<1) nanowire formed on a substrate.

18. An electronic apparatus comprising a phase change memory device of claim 1.

* * * * *